(12) United States Patent
Kim et al.

(10) Patent No.: US 8,835,203 B2
(45) Date of Patent: Sep. 16, 2014

(54) ORGANIC LIGHT EMITTING DIODE DISPLAY AND METHOD FOR MANUFACTURING THE SAME

(71) Applicant: LG Display Co., Ltd., Seoul (KR)

(72) Inventors: Hyunho Kim, Paju-si (KR); Seokwoo Lee, Bucheon-si (KR); Heedong Choi, Seosan-si (KR); Sangjin Lee, Goyang-si (KR); Seongmoh Seo, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/969,236

(22) Filed: Aug. 16, 2013

(65) Prior Publication Data

US 2013/0334514 A1     Dec. 19, 2013

Related U.S. Application Data

(63) Continuation of application No. 13/236,225, filed on Sep. 19, 2011, now Pat. No. 8,535,975.

(30) Foreign Application Priority Data

Sep. 20, 2010 (KR) .................. 10-2010-0092419
Sep. 20, 2010 (KR) .................. 10-2010-0092420

(51) Int. Cl.
| | |
|---|---|
| *H01L 21/00* | (2006.01) |
| *H01L 51/52* | (2006.01) |
| *H01L 51/56* | (2006.01) |
| *H01L 27/32* | (2006.01) |

(52) U.S. Cl.
CPC ........... *H01L 51/52* (2013.01); *H01L 2251/558* (2013.01); *H01L 27/3265* (2013.01); *H01L 2227/323* (2013.01); *H01L 27/3258* (2013.01); *H01L 51/56* (2013.01); *H01L 27/3244* (2013.01)

USPC .................. 438/30; 438/99; 438/69; 438/82; 438/158; 438/149; 257/30; 257/40; 257/642; 257/443; 257/462; 257/759; 257/291; 349/43

(58) Field of Classification Search
None
See application file for complete search history.

(56) References Cited

U.S. PATENT DOCUMENTS

| | | |
|---|---|---|
| 2010/0044692 A1 | 2/2010 | Kim et al. |
| 2010/0193790 A1 | 8/2010 | Yeo et al. |
| 2011/0079786 A1 | 4/2011 | Kwon et al. |
| 2011/0186847 A1 | 8/2011 | Kim et al. |
| 2011/0278615 A1 | 11/2011 | No et al. |

*Primary Examiner* — Steven Loke
*Assistant Examiner* — Cuong B Nguyen
(74) *Attorney, Agent, or Firm* — Birch, Stewart, Kolasch & Birch, LLP

(57) ABSTRACT

An organic light emitting diode (OLED) display and a method for manufacturing the same are provided. The OLED display includes a substrate, an active layer and a capacitor lower electrode positioned on the substrate, a gate insulating layer positioned on the active layer and the capacitor lower electrode, a gate electrode positioned on the gate insulating layer at a location corresponding to the active layer, a capacitor upper electrode positioned on the gate insulating layer at a location corresponding to the capacitor lower electrode, a first electrode positioned to be separated from the gate electrode and the capacitor upper electrode, an interlayer insulating layer positioned on the gate electrode, the capacitor upper electrode, and the first electrode, a source electrode and a drain electrode positioned on the interlayer insulating layer, and a bank layer positioned on the source and drain electrodes.

4 Claims, 12 Drawing Sheets

ORGANIC LIGHT EMITTING DIODE DISPLAY AND METHOD FOR MANUFACTURING THE SAME

This application is a Divisional of co-pending application Ser. No. 13/236,225 filed Sep. 19, 2011, which claims priority to and the benefit of Korean Patent Application Nos. 10-2010-0092419 and 10-2010-0092420 filed on Sep. 20, 2010. The entire contents of all the above applications are incorporated herein by reference for all purposes in its entirety.

BACKGROUND OF THE INVENTION

1. Field of the Invention

Embodiments of the invention relate to an organic light emitting diode (OLED) display and a method for manufacturing the same.

2. Discussion of the Related Art

The importance of flat panel displays has recently increased with the growth of multimedia technologies. Various flat panel displays such as liquid crystal displays (LCDs), plasma display panels (PDPs), field emission displays (FEDs), and organic light emitting diode (OLED) displays have been put to practical use.

Among the flat panel displays, the liquid crystal display has better visibility and lower power consumption than a cathode ray tube. On the other hand, the OLED display has a fast response time equal to or less than about 1 ms, low power consumption, and a wide viewing angle. Thus, the OLED display having a self-emitting structure has been considered as a next generation display.

FIG. 1 illustrates a related art OLED display.

As shown in FIG. 1, a buffer layer 110 is positioned on a substrate 100, an active layer 115a and a capacitor lower electrode 115b are positioned on the buffer layer 110, and a gate insulating layer 120 for insulating the active layer 115a and the capacitor lower electrode 115b is positioned on the active layer 115a and the capacitor lower electrode 115b. A gate electrode 130a and a capacitor upper electrode 130b are positioned on the gate insulating layer 120, and an interlayer insulating layer 135 for insulating the gate electrode 130a and the capacitor upper electrode 130b is positioned on the gate electrode 130a and the capacitor upper electrode 130b. A source electrode 145a and a drain electrode 145b connected to the active layer 115a through contact holes 140a and 140b are positioned on the interlayer insulating layer 135, thereby constituting a thin film transistor (TFT).

A passivation layer 150 and a first electrode 160, which is connected to the drain electrode 145b through a via hole 155, are positioned on the TFT. A bank layer 165 including an opening 170 exposing the first electrode 160 is positioned on the substrate 100, and an organic layer 175 is positioned on the first electrode 160. A spacer 180 is positioned around the organic layer 175, and a second electrode 185 is positioned on the substrate 100. In this way, the OLED display having the above-described configuration is formed.

The related art OLED display may be manufactured using a total of nine masks for forming the active layer 115a, the capacitor lower electrode 115b, the gate electrode 130a, the contact holes 140a and 140b, the source electrode 145a, the drain electrode 145b, the via hole 155, the first electrode 160, the opening 170, and the spacer 180.

However, because the related art OLED display is manufactured using the nine masks through a large number of processes, the manufacturing cost is high and the productivity is low.

SUMMARY OF THE INVENTION

Embodiments of the invention provide an organic light emitting diode (OLED) display and a method for manufacturing the same capable of reducing the number of masks and the manufacturing cost and increasing the productivity and the manufacturing yield.

In one aspect, there is an OLED display including a substrate, an active layer and a capacitor lower electrode, which are positioned on the substrate to be separated from each other, a gate insulating layer positioned on the active layer and the capacitor lower electrode, a gate electrode positioned on the gate insulating layer at a location corresponding to the active layer, a capacitor upper electrode positioned on the gate insulating layer at a location corresponding to the capacitor lower electrode, a first electrode positioned to be separated from the gate electrode and the capacitor upper electrode, an interlayer insulating layer positioned on the gate electrode, the capacitor upper electrode, and the first electrode, a source electrode and a drain electrode, which are positioned on the interlayer insulating layer and connected to the active layer, one of the source electrode and the drain electrode being connected to the first electrode, a bank layer positioned on the source electrode and the drain electrode, the bank layer exposing a portion of the first electrode, a spacer positioned on the bank layer, an organic layer positioned on the exposed portion of the first electrode, and a second electrode positioned on the organic layer.

In another aspect, there is an OLED display including a substrate, an active layer and a silicon pattern positioned on the substrate, a first insulating pattern positioned on the active layer and a second insulating pattern positioned on the silicon pattern, a capacitor lower electrode positioned on the second insulating pattern, a gate insulating layer positioned on the first insulating pattern and the capacitor lower electrode, a gate electrode positioned on the gate insulating layer at a location corresponding to the active layer, a capacitor upper electrode positioned on the gate insulating layer at a location corresponding to the capacitor lower electrode, a first electrode positioned to be separated from the gate electrode and the capacitor upper electrode, an interlayer insulating layer positioned on the gate electrode, the capacitor upper electrode, and the first electrode, a source electrode and a drain electrode, which are positioned on the interlayer insulating layer and connected to the active layer, one of the source electrode and the drain electrode being connected to the first electrode, a bank layer positioned on the source electrode and the drain electrode, the bank layer exposing a portion of the first electrode, a spacer positioned on the bank layer, an organic layer positioned on the exposed portion of the first electrode, and a second electrode positioned on the organic layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
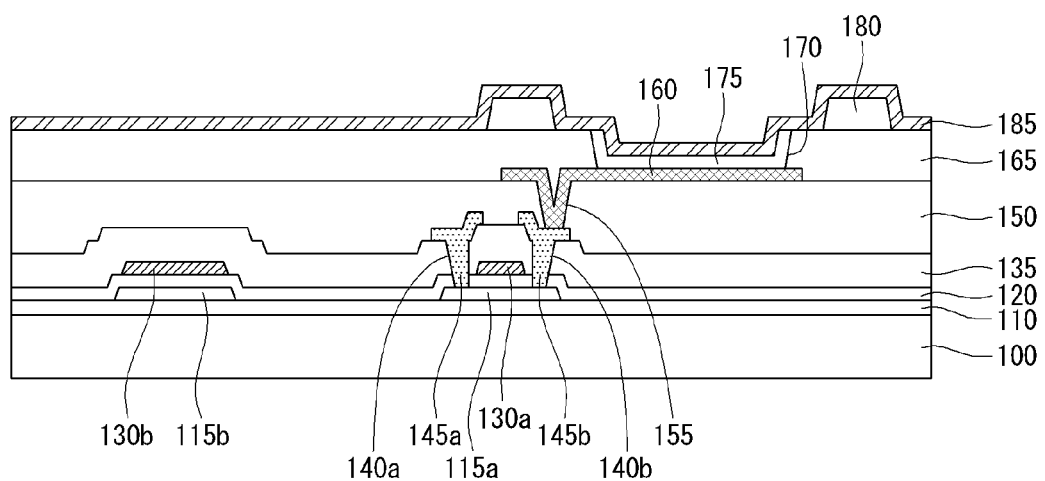
FIG. 1 illustrates a related art organic light emitting diode (OLED) display.

Reference will now be made in detail to the specific embodiments of the invention, examples of which are illustrated in the accompanying drawings. Wherever possible, the same reference numbers will be used throughout the drawings to refer to the same or like parts. Detailed description of known arts will be omitted to avoid obscuring the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Figure 2:
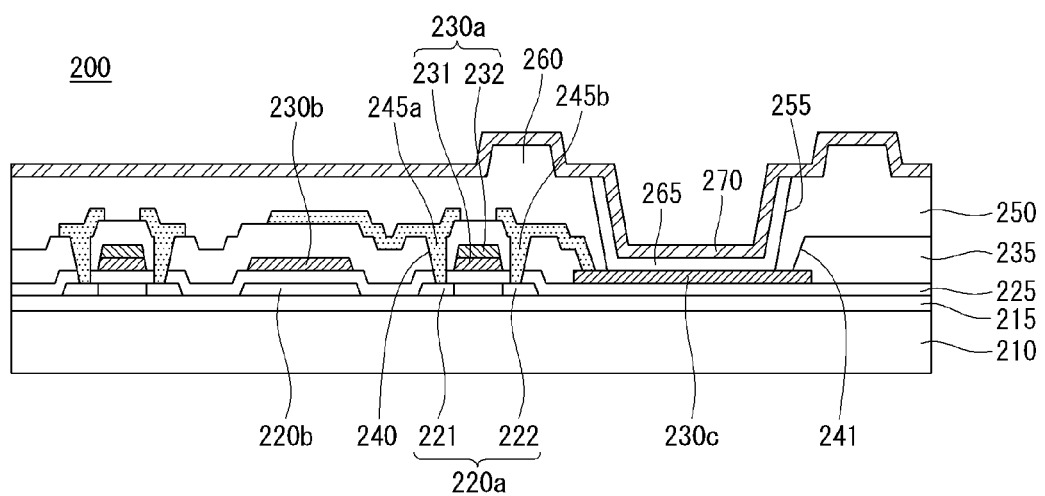
FIG. 2 is a cross-sectional view of an OLED display according to a first embodiment of the invention.

FIG. 2 is a cross-sectional view of an organic light emitting diode (OLED) display according to a first embodiment of the invention.

As shown in FIG. 2, in an OLED display 200 according to a first embodiment of the invention, a buffer layer 215 is positioned on a substrate 210, and an active layer 220a and a capacitor lower electrode 220b are positioned on the buffer layer 215. The active layer 220a is doped with impurities and thus includes a source region 221 and a drain region 222. The capacitor lower electrode 220b is doped with impurities.

A gate insulating layer 225 is positioned on the active layer 220a and the capacitor lower electrode 220b. A gate electrode 230a and a capacitor upper electrode 230b are positioned on the gate insulating layer 225. The gate electrode 230a is positioned at a location corresponding to the active layer 220a, and the capacitor upper electrode 230b is positioned at a location corresponding to the capacitor lower electrode 220b. The gate electrode 230a may have a two-layered structure of a stack of a metal oxide pattern (a metal oxide material) 231 and a metal pattern (a metal material) 232. A first electrode 230c is positioned to be separated from the gate electrode 230a and the capacitor upper electrode 230b. The first electrode 230c is positioned on the gate insulating layer 225.

An interlayer insulating layer 235 is positioned on the gate electrode 230a, the capacitor upper electrode 230b, and the first electrode 230c. A contact hole 240 exposing the source region 221 and the drain region 222 of the active layer 220a and an opening 241 exposing the first electrode 230c are formed in the interlayer insulating layer 235.

A source electrode 245a and a drain electrode 245b are positioned on the interlayer insulating layer 235. The source electrode 245a and the drain electrode 245b respectively contact the source region 221 and the drain region 222 of the active layer 220a, and the drain electrode 245b contacts the first electrode 230c.

A bank layer 250 and a spacer 260 are positioned on the substrate 210, on which the source electrode 245a and the drain electrode 245b are formed. An opening 255 exposing the first electrode 230c is formed in the bank layer 250. The spacer 260 protrudes further than the surface of the bank layer 250 and forms an integral body along with the bank layer 250. Further, the spacer 260 is positioned around (or at the periphery of) the exposed first electrode 230c.

An organic layer 265 is positioned on the exposed first electrode 230c. A portion of the organic layer 265 is positioned on a lateral surface of the bank layer 250 at the opening 255. The organic layer 265 may include a light emitting layer and at least one of a hole injection layer, a hole transport layer, an electron transport layer, and an electron injection layer. A second electrode 270 is positioned on the substrate 210 including the organic layer 265. In this way, the OLED display 200 according to the first embodiment of the invention may be configured.

FIGS. 3A to 3K are cross-sectional views sequentially illustrating stages in a method for manufacturing an OLED display according to a first embodiment of the invention.

Figure 3A:
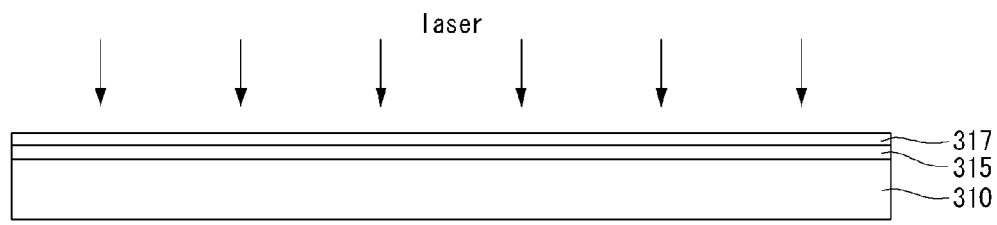
FIGS. 3A to 3K are cross-sectional views sequentially illustrating stages in a method for manufacturing an OLED display according to a first embodiment of the invention.

As shown in FIG. 3A, a buffer layer 315 is formed on a substrate 310 formed of glass, plastic, or a conductive material. The buffer layer 315 prevents impurities existing at the surface of the substrate 310 from being gushed or released in a subsequent laser crystallization process of an amorphous silicon layer and prevents the impurities from being dispersed into the amorphous silicon layer. The buffer layer 315 may be formed using silicon oxide (SiOx), silicon nitride (SiNx), or a stack thereof. Other materials may be used for the buffer layer 315.

An amorphous silicon layer 317 is deposited on the buffer layer 315. Subsequently, a laser crystallization process for irradiating a laser onto the amorphous silicon layer 317 is performed. The laser crystallization process may be performed through an excimer laser annealing (ELA) method. Thus, the amorphous silicon layer 317 is crystallized to form a polycrystalline silicon layer.

Figure 3B:
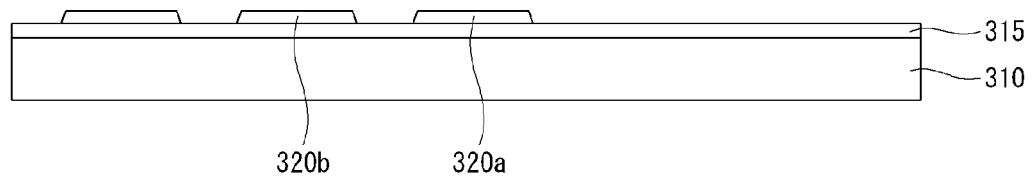

Next, as shown in FIG. 3B, the polycrystalline silicon layer is patterned using a first mask to form an active layer 320a and a capacitor lower electrode 320b.

Figure 3C:
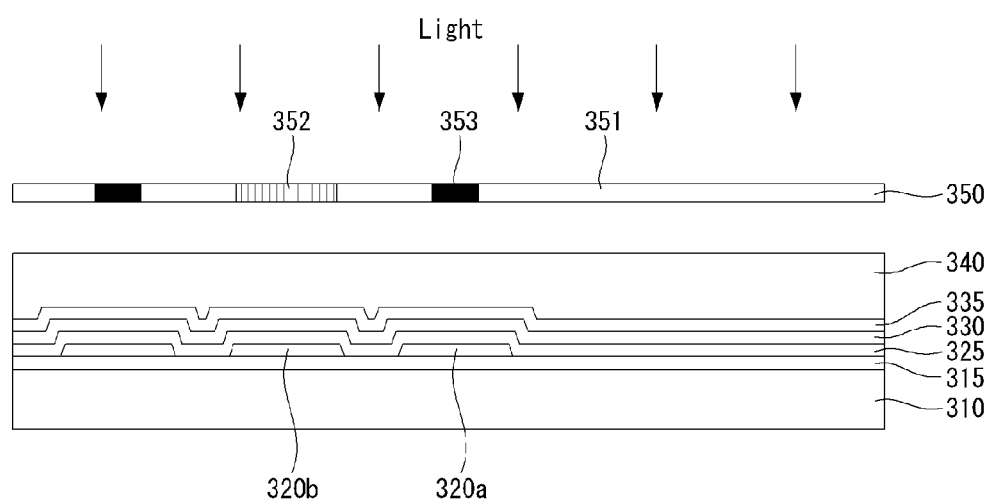

Next, as shown in FIG. 3C, a gate insulating layer 325 is formed on the substrate 310 including the active layer 320a and the capacitor lower electrode 320b. The gate insulating layer 325 may be formed using silicon oxide (SiOx), silicon nitride (SiNx), or a stack thereof. Other materials may be used for the gate insulating layer 325.

Subsequently, a metal oxide layer 330 and a metal layer 335 are sequentially stacked on the gate insulating layer 325. The metal oxide layer 330 may be formed of indium tin oxide (ITO), indium zinc oxide (IZO), or indium tin zinc oxide (ITZO). The metal layer 335 may be a single layer formed of aluminum (Al), molybdenum (Mo), tungsten (W), titanium (Ti), or an alloy thereof, or a multilayer formed of Mo/Al/Mo or Ti/Al/Ti. Other metal materials may be used for the metal layer 335.

Next, a first photosensitive layer 340 is coated on the substrate 310 including the metal oxide layer 330 and the metal layer 335 using a spin coating method, etc. The first photosensitive layer 340 may be a positive photoresist. Thus, when light is incident on the first photosensitive layer 340, the first photosensitive layer 340 may be a material which is subsequently decomposed and removed.

Subsequently, a first halftone mask 350 including a penetrable part 351, a semipenetrable part 352, and a block part 353, is aligned on the substrate 310, on which the first photosensitive layer 340 is formed. Ultraviolet light is then irradiated onto the first halftone mask 350.

Figure 3D:
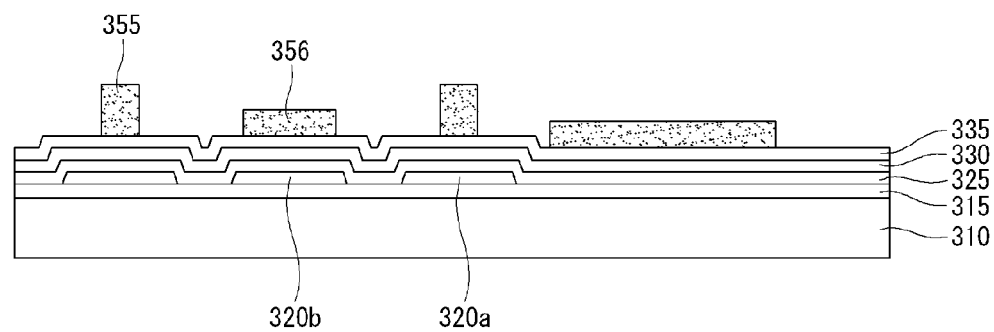

Next, as shown in FIG. 3D, a first photosensitive pattern 355 and a second photosensitive pattern 356 are developed using a diffraction exposure technique with the first halftone mask 350 to form the first photosensitive pattern 355 and the second photosensitive pattern 356 each having a different thickness.

More specifically, the diffraction exposure technique is applied to the first halftone mask 350 including the penetrable part 351, the semipenetrable part 352, and the block part 353. Hence, a portion of the first photosensitive layer 340 opposite the block part 353 is not removed and remains to form the first photosensitive pattern 355. Further, a portion of the first photosensitive layer 340 opposite the semipenetrable part 352 is diffracted to form the second photosensitive pattern 356 having a thickness equal to or less than about ½ of a thickness of the first photosensitive pattern 355 by light transmitted by the semipenetrable part 352. Further, a portion of the first photosensitive layer 340 opposite the penetrable part 351 is developed, decomposed, and completely removed. Hence, the surface of the metal layer 335 is exposed.

The first photosensitive pattern 355 is formed in an area where a gate electrode will be subsequently formed. The second photosensitive pattern 356 is formed in an area where a capacitor upper electrode and a first electrode will be subsequently formed.

Figure 3E:
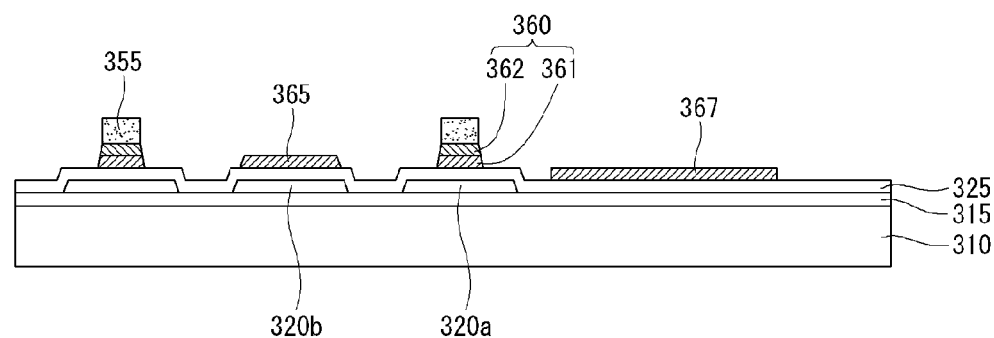

Next, as shown in FIG. 3E, the metal oxide layer 330 and the metal layer 335 are etched using the first photosensitive pattern 355 and the second photosensitive pattern 356 to form a metal oxide pattern and a metal pattern. Subsequently, an ashing process is performed to remove the second photosensitive pattern 356 and to reduce the thickness of the first photosensitive pattern 355 by the removed thickness of the second photosensitive pattern 356.

Subsequently, only the metal layer 335 in a removal area of the second photosensitive pattern 356 is etched using an etchant capable of etching not the metal oxide layer 330 but the metal layer 335 to form a capacitor upper electrode 365 and a first electrode 367.

The first photosensitive pattern 355 remaining on the substrate 310 is stripped and removed. Hence, as shown in FIG. 3F, a gate electrode 360 is formed.

Figure 3F:
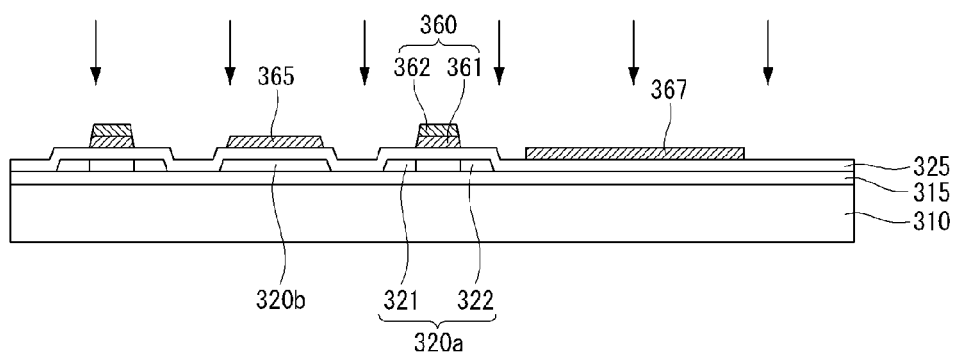

Thus, as shown in FIG. 3F, the gate electrode 360 having a stack of a metal oxide pattern (a metal oxide material) 361 and a metal pattern (a metal material) 362 is formed on the gate insulating layer 325. The capacitor upper electrode 365 and the first electrode 367 each including only the metal oxide pattern 361 are formed.

Subsequently, the substrate 310 is doped with impurities. In this instance, both sides of the active layer 320a are doped with impurities using the gate electrode 360 as a mask. Thus, a source region 321 and a drain region 322 of the active layer 320a are formed. Further, the capacitor upper electrode 365 and the capacitor lower electrode 320b are doped with impurities.

Figure 3G:
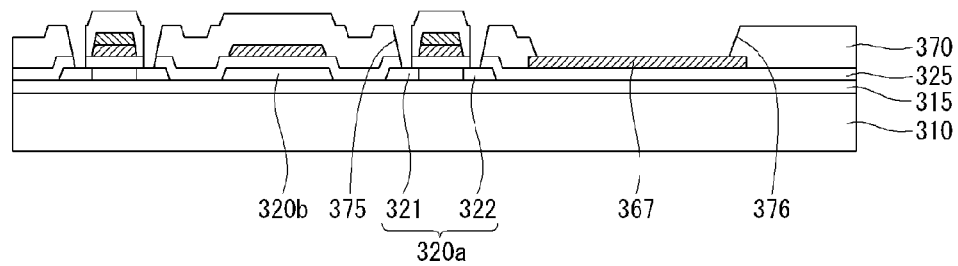

Next, as shown in FIG. 3G, an interlayer insulating layer 370 is formed on the substrate 310 doped with the impurities. The interlayer insulating layer 370 may be formed using silicon oxide (SiOx), silicon nitride (SiNx), or a stack thereof. Other materials may be used for the interlayer insulating layer 370.

Subsequently, the interlayer insulating layer 370 is patterned using a second mask to form a contact hole 375 exposing the source region 321 and the drain region 322 of the active layer 320a and to form an opening 376 exposing the first electrode 370.

Figure 3H:
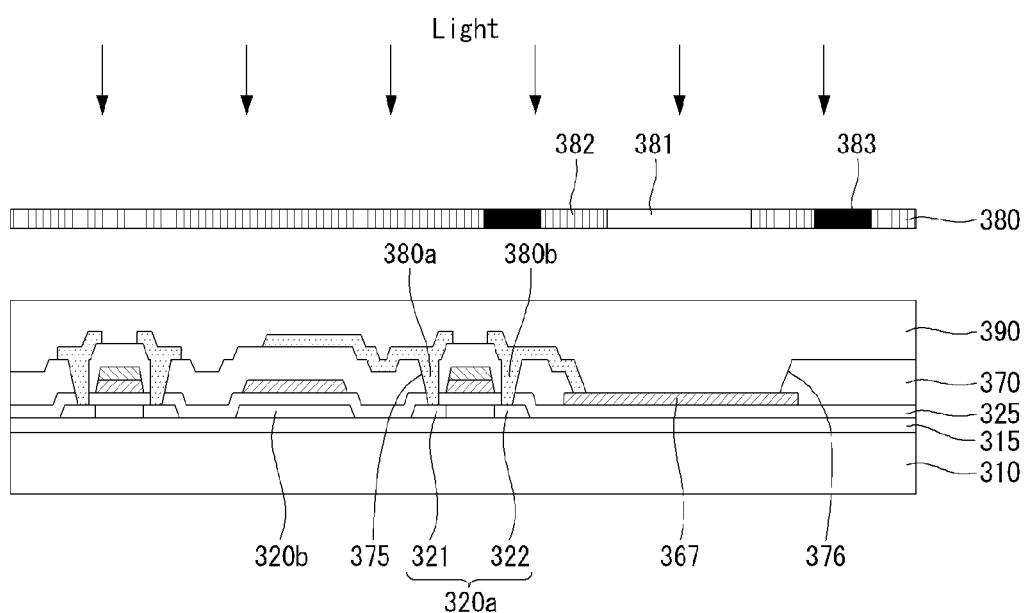

Next, as shown in FIG. 3H, a conductive layer is deposited on the substrate 310 and is patterned using a third mask to form a source electrode 380a and a drain electrode 380b. In this instance, the source electrode 380a and the drain electrode 380b contact the source region 321 and the drain region 322 of the active layer 320a through the contact hole 375, respectively. Further, the drain electrode 380b contacts the first electrode 367.

Each of the source electrode 380a and the drain electrode 380b may be a single layer formed of aluminum (Al), molybdenum (Mo), tungsten (W), titanium (Ti), or an alloy thereof. Alternatively, each of the source electrode 380a and the drain electrode 380b may be a multilayer formed of Mo/Al/Mo or Ti/Al/Ti. Other metal materials may be used for the each of the source electrode 380a and the drain electrode 380b.

Subsequently, a second photosensitive layer 390 is coated on the substrate 310 including the source electrode 380a and the drain electrode 380b using the spin coating method, etc. The second photosensitive layer 390 may be formed of the same material as the first photosensitive layer 340.

Subsequently, a second halftone mask 380 including a penetrable part 381, a semipenetrable part 382, and a block part 383 is aligned on the substrate 310, on which the second photosensitive layer 390 is formed. Ultraviolet light is then irradiated onto the second halftone mask 380. In this instance, the block part 383 is aligned in an area to form a spacer, the semipenetrable part 382 is aligned in an area to form a bank layer, and the penetrable part 381 is aligned in a formation area of the first electrode 367.

Figure 3I:
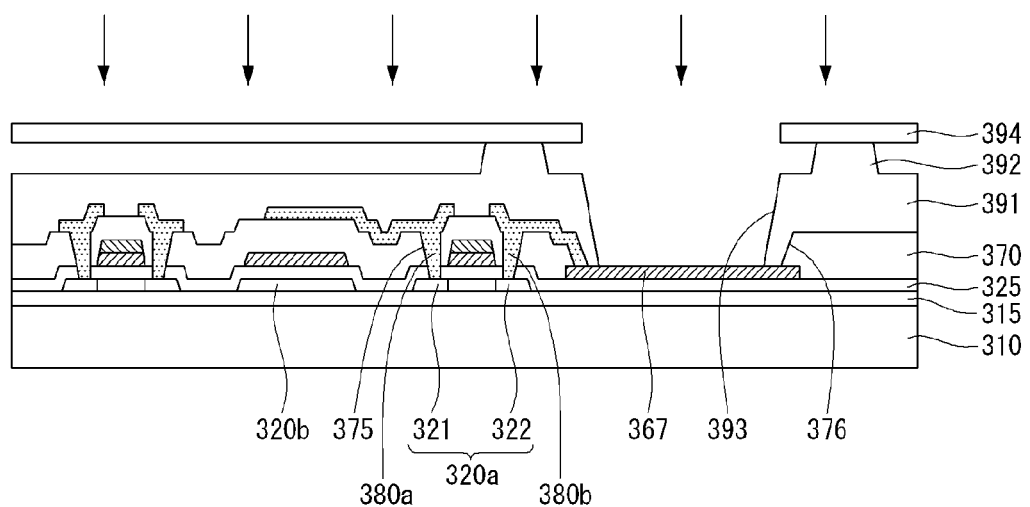

Next, as shown in FIG. 3I, the second photosensitive layer 390 is developed using the diffraction exposure technique to form a bank layer 391 and a spacer 392.

More specifically, the diffraction exposure technique is applied to the second halftone mask 380 including the penetrable part 381, the semipenetrable part 382, and the block part 383. Hence, a portion of the second photosensitive layer 390 opposite the block part 383 is not removed and remains to form the spacer 392. Further, a portion of the second photosensitive layer 390 opposite the semipenetrable part 382 is diffracted to form the bank layer 391 having a thickness less than the spacer 392 (such as a thickness equal to or less than about ½ of a thickness of the spacer 392) by light transmitted by the semipenetrable part 382. Further, a portion of the second photosensitive layer 390 opposite the penetrable part 381 is developed, decomposed, and completely removed to form an opening 393 exposing the surface of the first electrode 367.

As a result, as shown in FIG. 3I, the bank layer 391 and the spacer 392 are simultaneously formed and may form an integral body.

Next, the substrate 310, on which the bank layer 391 and the spacer 392 are formed, is placed inside a vacuum chamber, and a shadow mask 394 is aligned on the substrate 310. In this instance, the shadow mask 394 is aligned on the spacer 392.

Figure 3J:
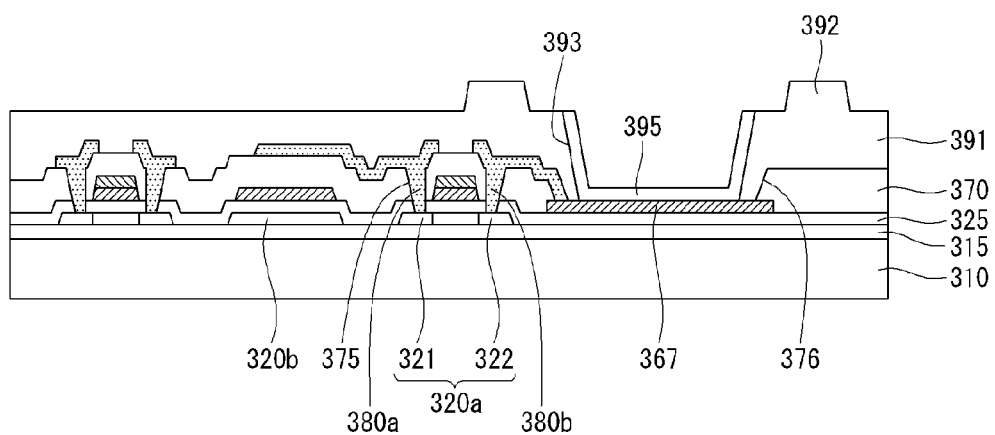

As shown in FIG. 3J, an organic material is deposited on the substrate 310 to form an organic layer 395 on the first electrode 367. The organic layer 395 may include a light emitting layer and at least one of a hole injection layer, a hole transport layer, an electron transport layer, and an electron injection layer.

Figure 3K:
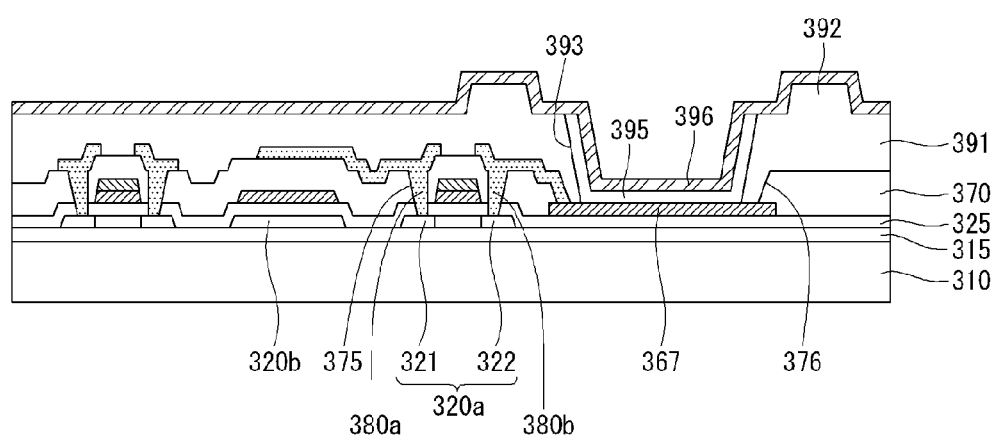

Next, as shown in FIG. 3K, a metal material is deposited on the substrate 310 to form a second electrode 396. The second electrode 396 may be formed of magnesium (Mg), silver (Ag), aluminum (Al), calcium (Ca), or an alloy thereof having a low line resistance and a low work function. Other metal materials may be used for the second electrode 396.

In this way, the OLED display according to the first embodiment of the invention is manufactured.

As described above, the OLED display according to the first embodiment of the invention may be manufactured using a total of five masks including the first to third masks and the first and second halftone masks, as compared the related art OLED display manufactured using a total of nine masks. Accordingly, the OLED display according to the first embodiment of the invention may reduce use of four masks as compared the related art OLED display. As a result, the manufacturing cost may be reduced, and the productivity and the manufacturing yield may be improved.

Figure 4:
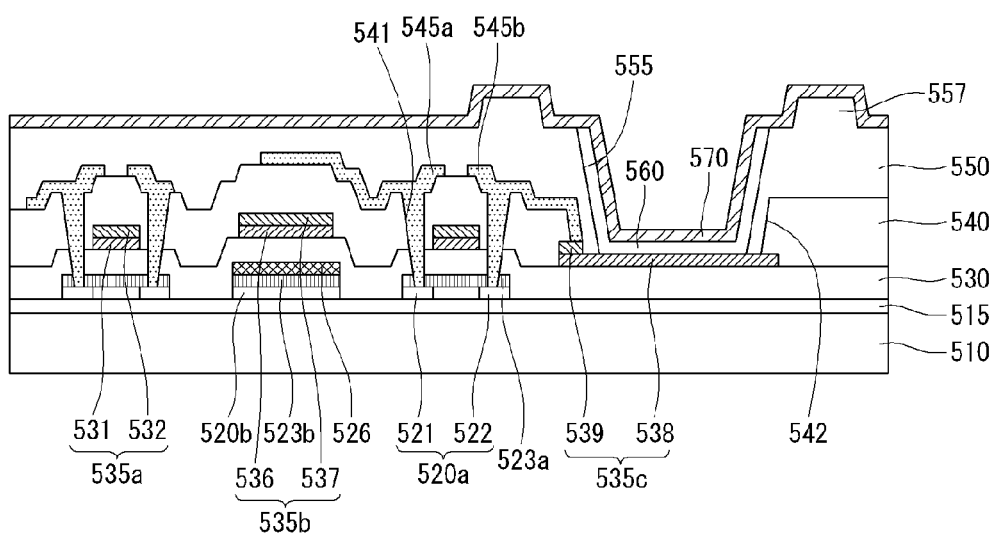
FIG. 4 is a cross-sectional view of an OLED display according to a second embodiment of the invention.

FIG. 4 is a cross-sectional view of an OLED display according to a second embodiment of the invention.

As shown in FIG. 4, in an OLED display 500 according to a second embodiment of the invention, a buffer layer 515 is positioned on a substrate 510, and an active layer 520a and a silicon pattern 520b are positioned on the buffer layer 515. The active layer 520a is doped with impurities and thus includes a source region 521 and a drain region 522.

A first insulating pattern 523a is positioned on the active layer 520a, and a second insulating pattern 523b is positioned on the silicon pattern 520b. A capacitor lower electrode 526 is positioned on the second insulating pattern 523b.

A gate insulating layer 530 is positioned on the first insulating pattern 523a and the capacitor lower electrode 526. A gate electrode 535a and a capacitor upper electrode 535b are positioned on the gate insulating layer 530. The gate electrode 535a is positioned at a location corresponding to the active layer 520a, and the capacitor upper electrode 535b is positioned at a location corresponding to the capacitor lower electrode 526. The gate electrode 535a may have a two-layered structure of a stack of a first metal oxide pattern (a first metal oxide material) 531 and a first metal pattern (a first metal material) 532. The capacitor upper electrode 535b may have a two-layered structure of a stack of a second metal oxide pattern (a second metal oxide material) 536 and a second metal pattern (second metal material) 537.

A first electrode 535c is positioned to be separated from the gate electrode 535a and the capacitor upper electrode 535b. The first electrode 535c may have a two-layered structure of a stack of a third metal oxide pattern (a third metal oxide material) 538, and a third metal pattern (a third metal material) 539 positioned at one edge of the third metal oxide pattern 538.

An interlayer insulating layer 540 is positioned on the gate electrode 535a, the capacitor upper electrode 535b, and the first electrode 535c.

The interlayer insulating layer 540 includes a contact hole 541 exposing the source region 521 and the drain region 522 of the active layer 520a and an opening 542 exposing the first electrode 535c.

A source electrode 545a and a drain electrode 545b are positioned on the interlayer insulating layer 540. The source electrode 545a and the drain electrode 545b respectively contact the source region 521 and the drain region 522 of the active layer 520a, and the drain electrode 545b contacts the first electrode 535c.

A bank layer 550 and a spacer 557 are positioned on the substrate 510, on which the source electrode 545a and the drain electrode 545b are formed. The bank layer 550 includes an opening 555 exposing the first electrode 535c. The spacer 557 protrudes further than the surface of the bank layer 550 and forms an integral body along with the bank layer 550. Further, the spacer 557 is positioned around the exposed first electrode 535c.

An organic layer 560 is positioned on the exposed first electrode 535c. A portion of the organic layer 560 is positioned on a lateral surface of the bank layer 550 at the opening 555. The organic layer 560 may include a light emitting layer and at least one of a hole injection layer, a hole transport layer, an electron transport layer, and an electron injection layer. A second electrode 570 is positioned on the substrate 510 including the organic layer 560. In this way, the OLED display 500 according to the second embodiment of the invention is formed.

FIGS. 5A to 5J are cross-sectional views sequentially illustrating each of stages in a method for manufacturing an OLED display according to a second embodiment of the invention.

Figure 5A:
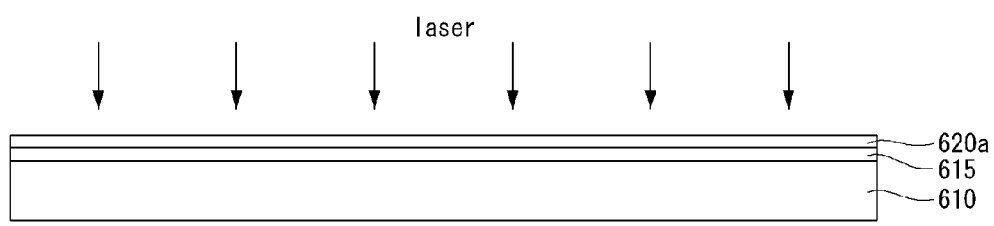
FIGS. 5A to 5J are cross-sectional views sequentially illustrating stages in a method for manufacturing an OLED display according to a second embodiment of the invention.

As shown in FIG. 5A, a buffer layer 615 is formed on a substrate 610 formed of glass, plastic, or a conductive material. The buffer layer 615 prevents impurities existing at the surface of the substrate 610 from being gushed or released in a subsequent laser crystallization process of an amorphous silicon layer and prevents the impurities from being dispersed into the amorphous silicon layer. The buffer layer 615 may be formed using silicon oxide (SiOx), silicon nitride (SiNx), or a stack thereof. Other materials may be used for the buffer layer 615.

An amorphous silicon layer 620a is deposited on the buffer layer 615. Subsequently, a laser crystallization process for irradiating a laser onto the amorphous silicon layer 620a is performed. The laser crystallization process may be performed through an excimer laser annealing (ELA) method. Thus, the amorphous silicon layer 620a is crystallized to form a polycrystalline silicon layer 620b.

Figure 5B:
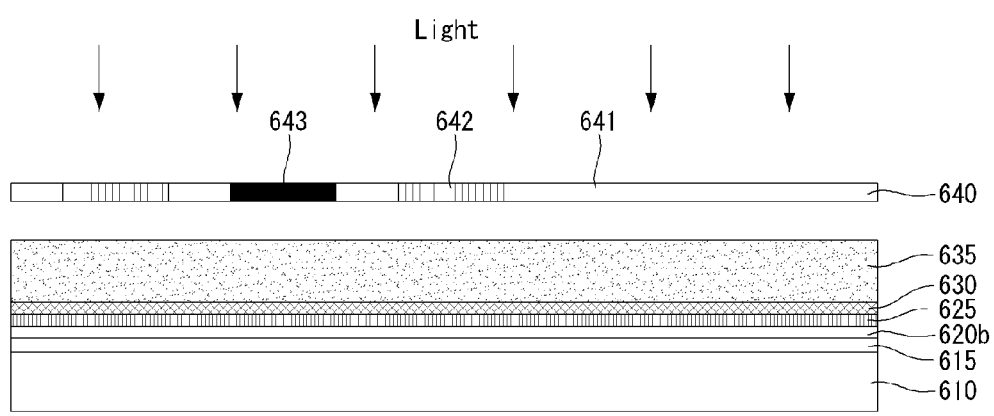

Next, as shown in FIG. 5B, a first insulating layer 625 is stacked on the polycrystalline silicon layer 620b, and a first metal layer 630 is stacked on the first insulating layer 625. The first insulating layer 625 may be formed of silicon oxide (SiOx) or silicon nitride (SiNx), and the first metal layer 630 may be formed of aluminum (Al), molybdenum (Mo), tungsten (W), titanium (Ti), or an alloy thereof. Other materials may be used for the first insulating layer 625, and other metal materials may be used for the first metal layer 630.

Next, a first photosensitive layer 635 is coated on the substrate 610 including the first insulating layer 625 and the first metal layer 630 using a spin coating method, etc. The first photosensitive layer 635 may be a positive photoresist. Thus, when light is incident on the first photosensitive layer 635, the first photosensitive layer 635 may be a material which is subsequently decomposed and removed.

Subsequently, a first halftone mask 640 including a penetrable part 641, a semipenetrable part 642, and a block part 643 is aligned on the substrate 610, on which the first photosensitive layer 635 is formed. Ultraviolet light is then irradiated onto the first halftone mask 640.

Figure 5C:
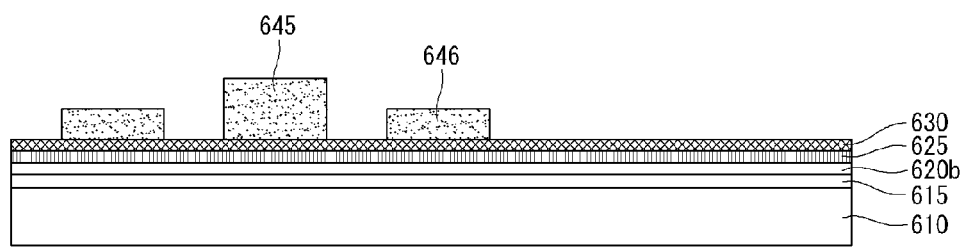

Next, as shown in FIG. 5C, the first halftone mask 640 is developed using a diffraction exposure technique to form a first photosensitive pattern 645 and a second photosensitive pattern 646 each having a different thickness.

More specifically, the diffraction exposure technique is applied to the first halftone mask 640 including the penetrable part 641, the semipenetrable part 642, and the block part 643. Hence, a portion of the first photosensitive layer 635 opposite the block part 643 is not removed and remains to form the first photosensitive pattern 645. Further, a portion of the first photosensitive layer 635 opposite the semipenetrable part 642 is diffracted to form the second photosensitive pattern 646 having a thickness equal to or less than about ½ of a thickness of the first photosensitive pattern 645 by light transmitted by the semipenetrable part 642. Further, a portion of the first photosensitive layer 635 opposite the penetrable part 641 is developed, decomposed, and completely removed. Hence, the surface of the metal layer 630 is exposed.

The first photosensitive pattern 645 is formed in an area where a capacitor lower electrode will be subsequently formed. The second photosensitive pattern 646 is formed in an area where an active layer will be subsequently formed.

Figure 5D:
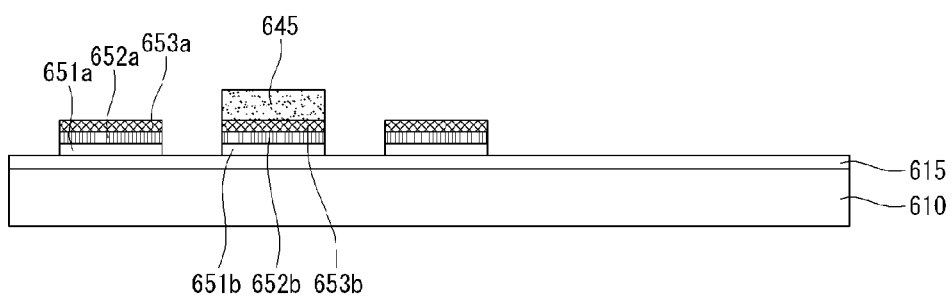

Next, as shown in FIG. 5D, the polycrystalline silicon layer 620b, the first insulating layer 625, and the first metal layer 630 are etched using the first photosensitive pattern 645 and the second photosensitive pattern 646 to form an active layer 651a, a first insulating pattern 652a on the active layer 651a, a first metal pattern 653a on the first insulating pattern 652a, a silicon pattern 651b, a second insulating pattern 652b on the silicon pattern 651b, and a capacitor lower electrode 653b on the second insulating pattern 652b.

Subsequently, an ashing process is performed to remove the second photosensitive pattern 646 and to reduce the thickness of the first photosensitive pattern 645 by the removed thickness of the second photosensitive pattern 646.

Figure 5E:
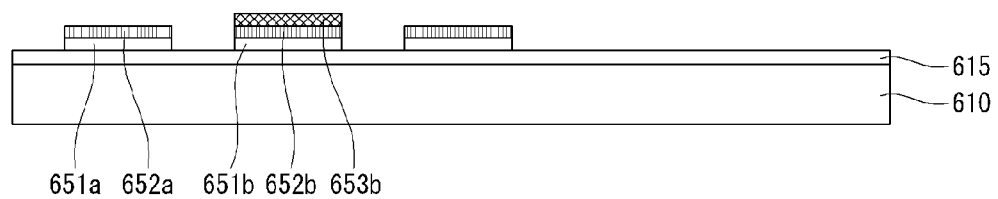

Next, as shown in FIG. 5E, the first metal pattern 653a in a removal area of the second photosensitive pattern 646 is etched using an etchant and is removed. The first photosensitive pattern 645 remaining on the substrate 610 is stripped and removed.

Thus, the active layer 651a is formed on the buffer layer 615, the first insulating pattern 652a is formed on the active layer 651a, the silicon pattern 651b is formed on the buffer layer 615, the second insulating pattern 652b is formed on the silicon pattern 651b, and the capacitor lower electrode 653b is formed on the second insulating pattern 652b.

Figure 5F:
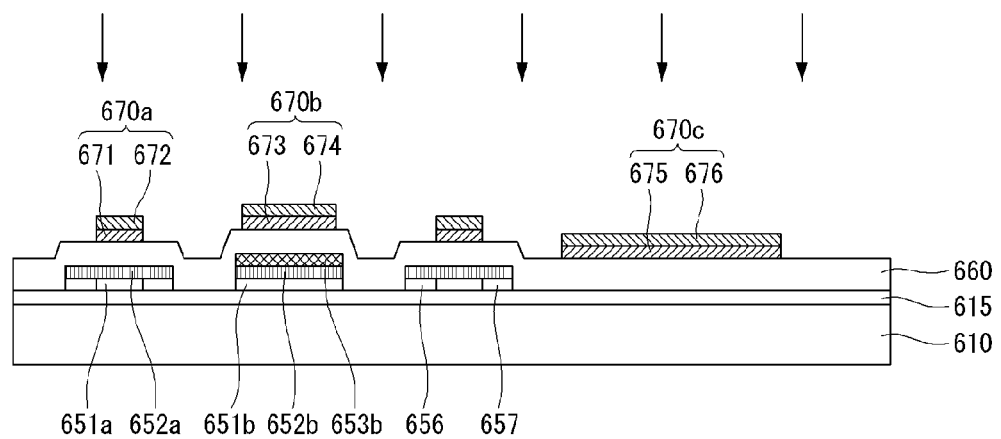

Next, as shown in FIG. 5F, a gate insulating layer 660 is formed on the substrate 610. The gate insulating layer 660 may be formed using silicon oxide (SiOx), silicon nitride (SiNx), or a stack thereof. Other materials may be used for the gate insulating layer 660.

Subsequently, a metal oxide layer and a second metal layer are sequentially stacked on the gate insulating layer 660 and are patterned using a first mask to form a gate electrode 670a, a capacitor upper electrode 670b, and a first electrode 670c.

The metal oxide layer may be formed of indium tin oxide (ITO), indium zinc oxide (IZO), or indium tin zinc oxide (ITZO). The second metal layer may be a single layer formed of aluminum (Al), molybdenum (Mo), tungsten (W), titanium (Ti), or an alloy thereof, or a multilayer formed of Mo/Al/Mo or Ti/Al/Ti. Other materials may be used for the metal oxide layer. Also, other metal materials may be used for the second metal layer.

Thus, the gate electrode 670a has a stack of a first metal oxide pattern (a first metal oxide pattern) 671 and a second metal pattern (a second metal material) 672, the capacitor upper electrode 670b has a stack of a second metal oxide pattern (a second metal oxide material) 673 and a third metal pattern (a third metal material) 674, and the first electrode 670c has a stack of a third metal oxide pattern (a third metal oxide material) 675 and a fourth metal pattern (a fourth metal material) 676.

Subsequently, the substrate 610 is doped with impurities. In this instance, both sides of the active layer 651a are doped with impurities using the gate electrode 670a as a mask. Thus, a source region 656 and a drain region 657 of the active layer 651a are formed.

Figure 5G:
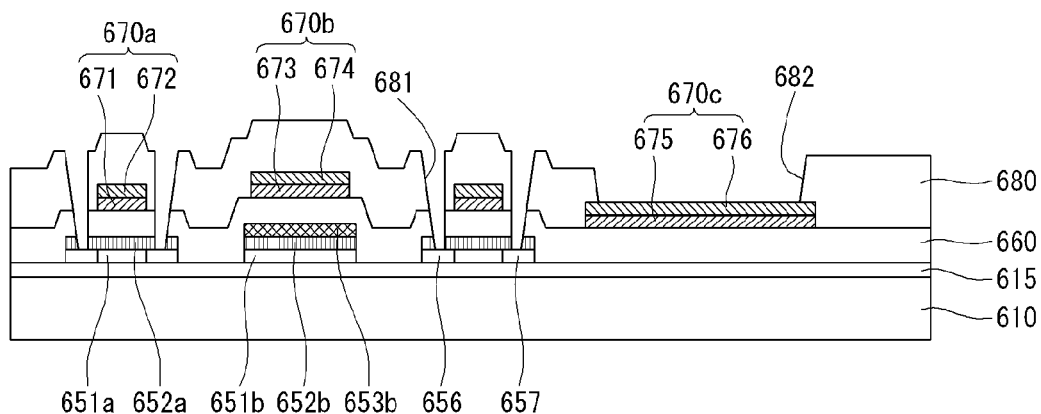

Next, as shown in FIG. 5G, an interlayer insulating layer 680 is formed on the substrate 610 doped with the impurities. The interlayer insulating layer 680 may be formed using silicon oxide (SiOx), silicon nitride (SiNx), or a stack thereof. Other materials may be used for the interlayer insulating layer 680.

Subsequently, the interlayer insulating layer 680 is patterned using a second mask to form a contact hole 681 exposing the source region 656 and the drain region 657 of the active layer 651a and to form an opening 682 exposing the first electrode 670c.

Figure 5H:
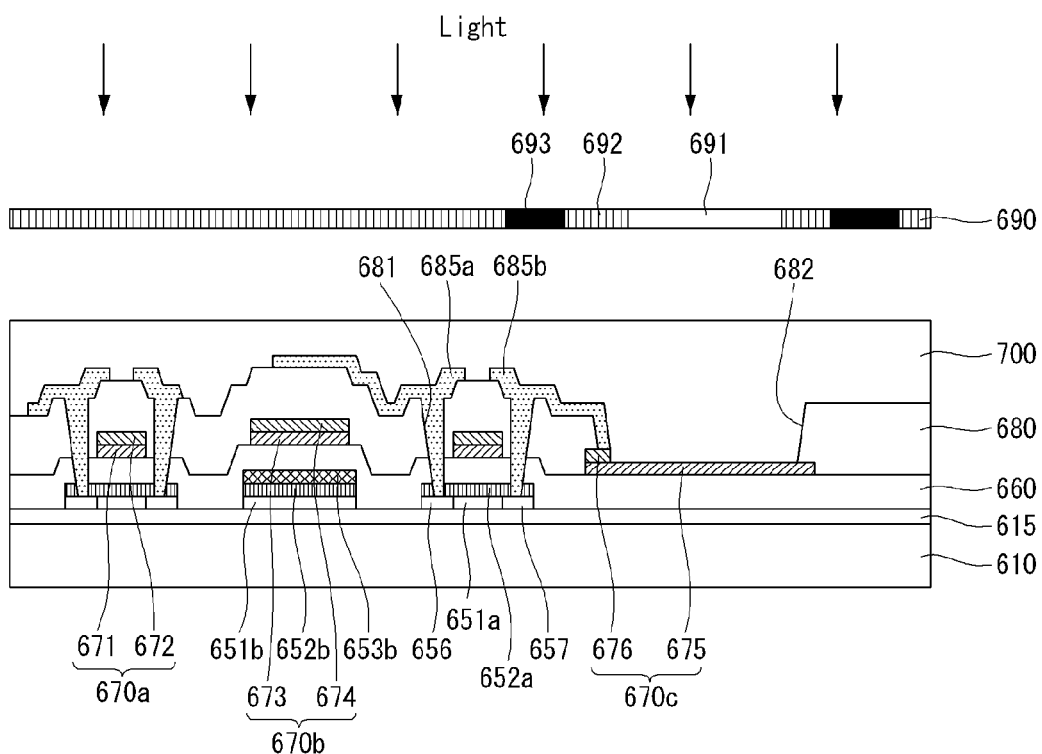

Next, as shown in FIG. 5H, a conductive layer is deposited on the substrate 610 and is patterned using a third mask to form a source electrode 685a and a drain electrode 685b. In this instance, the source electrode 685a and the drain electrode 685b contact the source region 656 and the drain region 657 of the active layer 651a through the contact hole 681, respectively. Further, the drain electrode 685b contacts the first electrode 670c.

In the patterning process of the conductive layer using the third mask, the fourth metal pattern 676 of the first electrode 670c is patterned and is positioned only at one edge of the third metal oxide pattern 675. Further, the drain electrode 685b contacts the fourth metal pattern 676 of the first electrode 670c.

Each of the source electrode 685a and the drain electrode 685b may be a single layer formed of aluminum (Al), molybdenum (Mo), tungsten (W), titanium (Ti), or an alloy thereof. Alternatively, each of the source electrode 685a and the drain electrode 685b may be a multilayer formed of Mo/Al/Mo or Ti/Al/Ti. Other metal materials may be used for the each of the source electrode 685a and the drain electrode 685b.

Subsequently, a second photosensitive layer 700 is coated on the substrate 610 including the source electrode 685a and the drain electrode 685b using the spin coating method, etc. The second photosensitive layer 700 may be formed of the same material as the first photosensitive layer 635.

Subsequently, a second halftone mask 690 including a penetrable part 691, a semipenetrable part 692, and a block part 693 is aligned on the substrate 610, on which the second photosensitive layer 700 is formed. Ultraviolet light is then irradiated onto the second halftone mask 690. In this instance, the block part 693 is aligned in an area to form a spacer, the semipenetrable part 692 is aligned in an area to form a bank layer, and the penetrable part 691 is aligned in a formation area of the first electrode 670c.

Figure 5I:
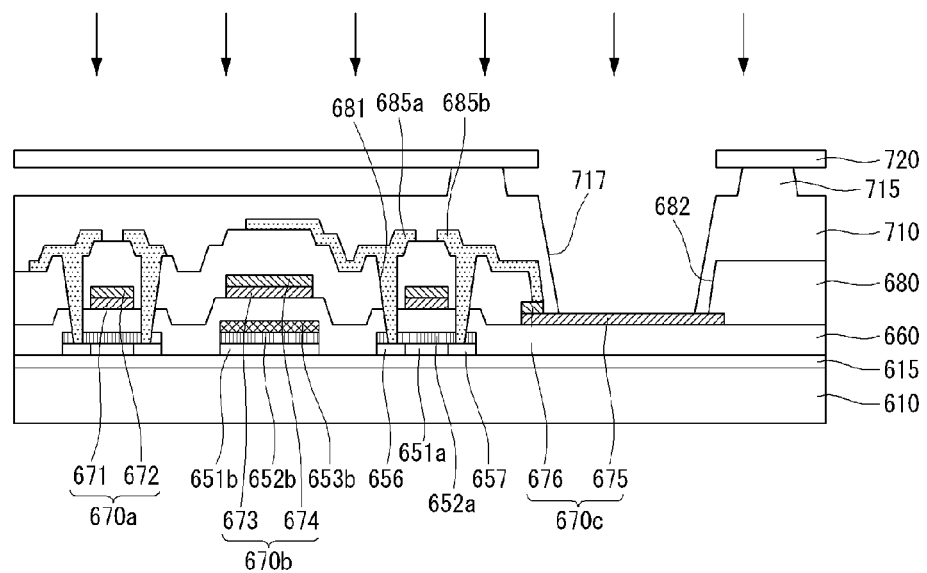

Next, as shown in FIG. 5I, the second halftone mask 690 is developed using the diffraction exposure technique to form a bank layer 710 and a spacer 715.

More specifically, the diffraction exposure technique is applied to the second halftone mask 690 including the penetrable part 691, the semipenetrable part 692, and the block part 693. Hence, a portion of the second photosensitive layer 700 opposite the block part 693 is not removed and remains to form the spacer 715. Further, a portion of the second photosensitive layer 700 opposite the semipenetrable part 692 is diffracted to form the bank layer 710 having a thickness less than the spacer 715 (such as a thickness equal to or less than about ½ of a thickness of the spacer 715) by light transmitted by the semipenetrable part 692. Further, a portion of the second photosensitive layer 700 opposite the penetrable part 691 is developed, decomposed, and completely removed to form an opening 717 exposing the surface of the first electrode 670c.

As a result, as shown in FIG. 5I, the bank layer 710 and the spacer 715 are simultaneously formed and may form an integral body.

Next, the substrate 610, on which the bank layer 710 and the spacer 715 are formed, is placed inside a vacuum chamber, and a shadow mask 720 is aligned on the substrate 610. In this instance, the shadow mask 720 is aligned on the spacer 715.

Figure 5J:
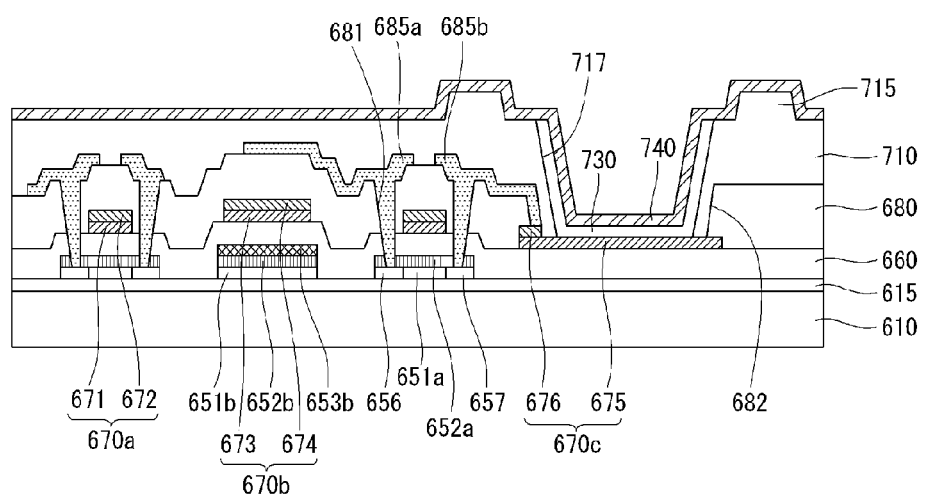

As shown in FIG. 5J, an organic material is deposited on the substrate 610 to form an organic layer 730 on the first electrode 670c. The organic layer 730 may include a light emitting layer and at least one of a hole injection layer, a hole transport layer, an electron transport layer, and an electron injection layer.

Next, a metal material is deposited on the substrate 610 to form a second electrode 740. The second electrode 740 may be formed of magnesium (Mg), silver (Ag), aluminum (Al), calcium (Ca), or an alloy thereof having a low line resistance and a low work function. Other metal materials may be used for the second electrode 740.

In this way, the OLED display according to the second embodiment of the invention is manufactured.

As described above, the OLED display according to the second embodiment of the invention may be manufactured using a total of five masks including the first to third masks and the first and second halftone masks, as compared the related art OLED display manufactured using a total of nine masks. Accordingly, the OLED display according to the second embodiment of the invention may reduce the use of four masks as compared the related art OLED display. As a result, the manufacturing cost may be reduced, and the productivity and the manufacturing yield may be improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an organic light emitting diode (OLED) display comprising:
   sequentially forming a polycrystalline silicon layer, an insulating layer, and a first metal layer on a substrate;
   coating a first photosensitive layer on the substrate and patterning the first photosensitive layer using a first halftone mask to form an active layer and a silicon pattern, and simultaneously forming a first insulating pattern on the active layer, a second insulating pattern on the silicon pattern, a first metal material on the first insulating pattern and a capacitor lower electrode on the second insulating pattern;
   forming a gate insulating layer on the active layer and the capacitor lower electrode;
   sequentially stacking a metal oxide layer and a second metal layer on the gate insulating layer and patterning the metal oxide layer and the second metal layer to form a gate electrode having a stack of a first metal oxide material and a second metal material, a capacitor upper electrode having a stack of a second metal oxide material and a third metal material, and a first electrode having a stack of a third metal oxide material and a fourth metal material;
   forming an interlayer insulating layer on the gate electrode, the capacitor upper electrode, and the first electrode;
   stacking a third metal layer on the interlayer insulating layer, and patterning the third metal layer to form a source electrode and a drain electrode and simultaneously patterning the fourth metal material formed on the first electrode;
   coating a second photosensitive layer on the source electrode, the drain electrode, and the first electrode and patterning the second photosensitive layer using a second halftone mask to form a bank layer and a spacer;
   forming an organic layer on the first electrode; and
   forming a second electrode on the organic layer.

2. The method of claim 1, wherein the sequentially forming of the polycrystalline silicon layer, the insulating layer, and the first metal layer includes:
   forming an amorphous silicon layer on the substrate;
   irradiating a laser onto the amorphous silicon layer and crystallizing the amorphous silicon layer to form the polycrystalline silicon layer;
   forming the insulating layer on the polycrystalline silicon layer; and
   forming the first metal layer on the insulating layer.

3. The method of claim 2, wherein the forming of the active layer and the silicon pattern, and the simultaneously forming of the first insulating pattern on the active layer, the second insulating pattern on the silicon pattern, the first metal material on the first insulating pattern and the capacitor lower electrode on the second insulating pattern include:
   coating the first photosensitive layer on the first metal layer and patterning the first photosensitive layer using the first halftone mask to form a first photosensitive pattern and a second photosensitive pattern each having a different thickness;
   etching the polycrystalline silicon layer, the insulating layer, and the first metal layer to form the active layer, the silicon pattern, the first insulating pattern on the active layer, the second insulating pattern on the silicon pattern, the first metal material on the first insulating pattern, and the capacitor lower electrode on the second insulating pattern;
   ashing the first photosensitive pattern and the second photosensitive pattern to reduce a thickness of the first photosensitive pattern and to remove the second photosensitive pattern;
   exposing the first metal material on the first insulating pattern by removing the second photosensitive pattern and etching the first metal material; and
   removing the first photosensitive pattern.

4. The method of claim 1, wherein the forming of the bank layer and the spacer includes:
   coating the second photosensitive layer;
   aligning the second halftone mask on the second photosensitive layer and exposing the second photosensitive layer; and
   developing the exposed second photosensitive layer to form the bank layer and the spacer.

* * * * *